United States Patent [19]
Chang et al.

[11] Patent Number: 5,893,740
[45] Date of Patent: Apr. 13, 1999

[54] METHOD OF FORMING A SHORT CHANNEL FIELD EFFECT TRANSISTOR

[75] Inventors: Chun-Yeh Chang; I-Feng Tseng; Jaw-Jia Tsai, all of Hsinchu, Taiwan

[73] Assignee: National Science Council, Taipei, Taiwan

[21] Appl. No.: 08/788,254

[22] Filed: Jan. 27, 1997

[30] Foreign Application Priority Data

Sep. 17, 1996 [TW] Taiwan ................ 85111371

[51] Int. Cl.$^6$ ............................ H01L 21/336
[52] U.S. Cl. .................. 438/289; 438/290; 438/302; 438/305
[58] Field of Search ................. 438/300, 301, 438/302, 303, 304, 305, 306, 289, 290, 291

[56] References Cited

U.S. PATENT DOCUMENTS

| | | | |
|---|---|---|---|
| 5,073,514 | 12/1991 | Ito et al. | 438/302 |
| 5,217,910 | 6/1993 | Shimizu et al. | 437/35 |
| 5,413,949 | 5/1995 | Hong | 438/290 |
| 5,496,751 | 3/1996 | Wei et al. | 437/41 |
| 5,578,509 | 11/1996 | Fujita | 437/35 |
| 5,631,485 | 5/1997 | Wei et al. | 257/344 |
| 5,650,340 | 7/1997 | Burr | 437/34 |
| 5,656,519 | 8/1997 | Mogami | 438/303 |
| 5,744,372 | 4/1998 | Bulucea | 437/34 |
| 5,792,699 | 8/1998 | Tsui | 438/290 |

OTHER PUBLICATIONS

Wolf, Silicon Processing for the VLSI Era vol. 3 pp. 622–621; "Improving the Short Channel Performance of the Conventional NMOS LDD", No month 1995.

*Primary Examiner*—Charles Bowers
*Assistant Examiner*—Jack Chen
*Attorney, Agent, or Firm*—Friedman Siegelbaum LLP

[57] ABSTRACT

A method of forming a short channel field effect transistor is disclosed. The method includes the steps of providing a semiconductor substrate having a well region of a first conductivity type; forming a gate electrode on the well region; implanting first impurities into the well region and adjacent to the gate electrode, the first implant step being at a first dose and a second conductivity type; forming sidewall spacers on edges of the gate electrode; implanting second impurities into the well region and adjacent to the gate electrode, the second implant step being at a second dose and at the second conductivity type; and implanting third impurities into the well region and adjacent the gate electrode, the third implant step being at a third dose and at the first conductivity type.

17 Claims, 3 Drawing Sheets

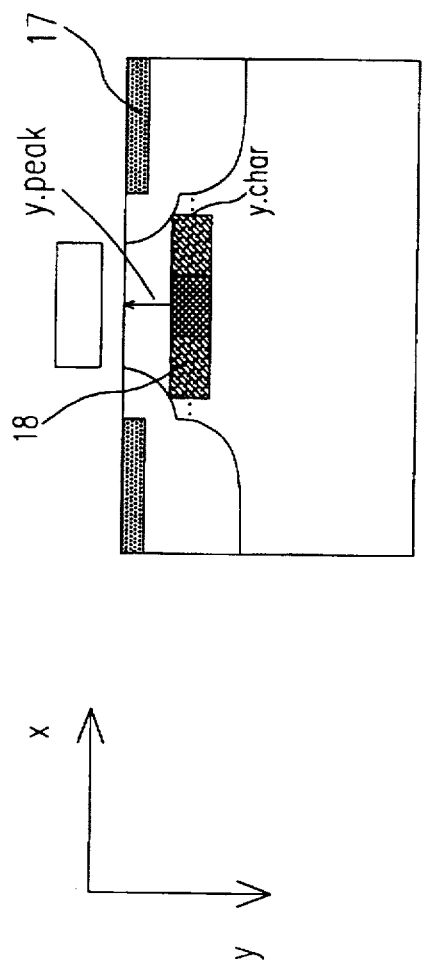
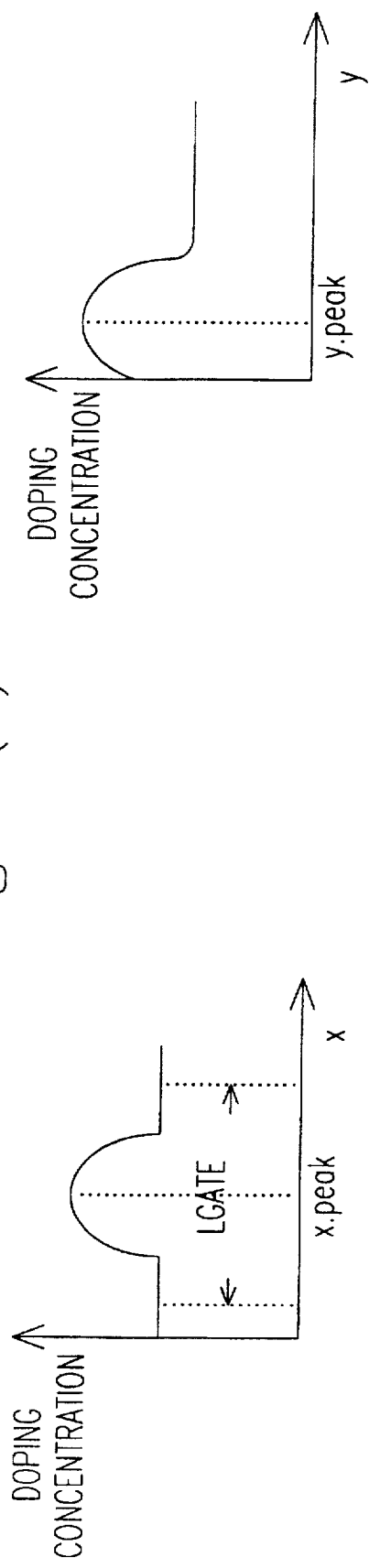
Fig. 2(a)
Fig. 2(b)
Fig. 2(c)

METHOD OF FORMING A SHORT CHANNEL FIELD EFFECT TRANSISTOR

FIELD OF THE INVENTION

The present invention relates to semiconductor integrated circuit fabrication, and more particularly to a method of forming a short channel field effect transistor.

BACKGROUND OF THE INVENTION

Industry utilizes or has proposed kinds of techniques for the manufacture of a MOS integrated circuit device. As the channel length ($L_{gate}$) becomes shorter and shorter, short channel effects tend to occur. Thus, how to suppress the short channel effects is very important in today's technology.

Punchthrough is one serious problem of the short channel effects. It makes the gate lose the ability to control the current. Therefore, when the device is scaled down, the punchthrough voltage ($V_{PT}$) is to be increased. Although to increase the substrate doping concentration is helpful in increasing the punchthrough voltage, at the same time the surface vertical field will also be increased so that the mobility will be lowered and the junction capacitance at the source and the drain regions will be increased. That is, the above method is not so satisfactory. One improvement of the above method is to keep the surface channel region at a relatively low concentration and the region between the source and the drain at a relatively higher concentration.

Some methods are also proposed to solve the above-mentioned problem:

(1) Atomic-Layer Doped (ALD) structure: this structure is formed by the epitaxy materials.

(2) Punchthrough stopper: this structure is executed by the implantation between the source and the drain to form a high concentration region therebetween.

(3) By the Self-aligned Pocket Implantation (SPI) technology to form a region under the lightly-doped drain (LDD) regions and at a concentration higher than that of the substrate. The punchthrough problem can thus be suppressed.

But these methods still have some drawbacks. In the high concentration region and the source/drain region, the P-N junction breakdown voltage is too low. In the device formed by the SPI technology, the source/drain junction capacitance is too high. These drawbacks will seriously affect the device speed.

From the above it is seen that a method of manufacturing a short channel field effect transistor with a higher punch-through voltage and a lower junction capacitance is often desired.

SUMMARY OF THE INVENTION

One objective of the present invention is to provide a method of manufacturing a short channel field effect transistor with a higher punchthrough voltage and a lower junction capacitance.

Another objective of the present invention is to provide a method of manufacturing a short channel field effect transistor with a higher drive capability.

A further objective of the present invention is to provide a method of manufacturing a short channel field effect transistor with a lower DIBL (drain-induced barrier lowering).

Still an objective of the present invention is to provide a method of manufacturing a short channel field effect transistor with a faster switch speed.

In a specific embodiment, the present invention provides a method of forming a semiconductor integrated circuit. The method includes the steps of: providing a semiconductor substrate having a well region of a first conductivity type; forming a gate electrode on the well region; implanting first impurities into the well region and adjacent to the gate electrode, the first implant step being at a first dose and a second conductivity type; forming sidewall spacers on edges of the gate electrode; implanting second impurities into the well region and adjacent to the gate electrode, the second implant step being at a second dose and at the second conductivity type; and implanting third impurities into the well region and adjacent the gate electrode, the third implant step being at a third dose and at the first conductivity type.

Certainly, a channel region can underlie the gate electrode. The third implant step can form an ion-implanted region under the channel. The second implant step can form source and drain regions of a field effect transistor at the well. The first dose can be less than second dose. The first implant step can form an LDD region of a field effect transistor at the well region.

Certainly, before the third implant step the present method can further include a step of forming suicide layers respectively on the gate electrode, the source, and the drain.

Certainly, the first conductivity type can be an N type and the second conductivity type can be a P type. Alternatively, the first conductivity type can be a P type and the second conductivity type can be an N type.

Certainly, the N type impurities can be phosphorus ions or arsenic ions. The P type impurities can be boron ions or $BF_2^+$.

Certainly, the gate electrode can include a polysilicon layer and a gate oxide layer.

Certainly, the third implant step can be executed by a large-angle-tilt implant. The angle of the third implant step can include an angle greater than about 30 degrees from a perpendicular from the gate electrode.

The forgoing and other objects, features, and advantages of the invention will be apparent from the following more particular description of a preferred embodiment of the invention, as illustrated in the accompanying drawings.

BRIEF DESCRIPTION OF THE DRAWING

FIGS. 2A–2C schematically show the dosage distribution of the ion-implanted region according to one preferred embodiment of the present invention.

DETAILED DESCRIPTION OF THE PREFERRED EMBODIMENT

Figure 1C:
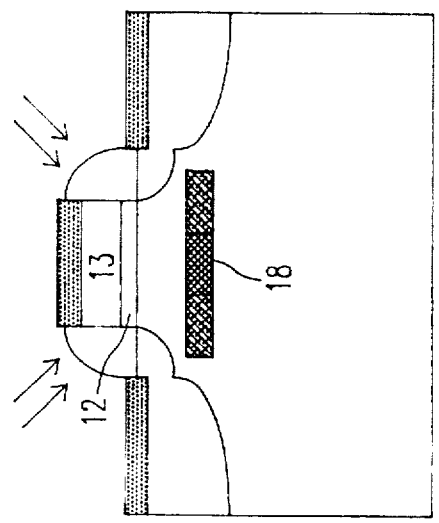
FIGS. 1A–1C illustrate an embodiment of a fabrication method according to the present invention in a P type channel device.
Figure 1B:
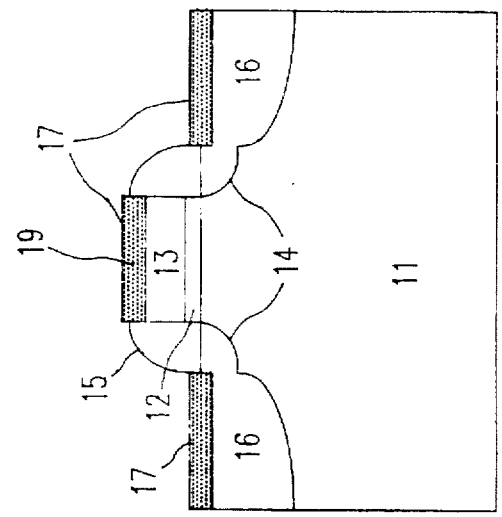
Figure 1A:
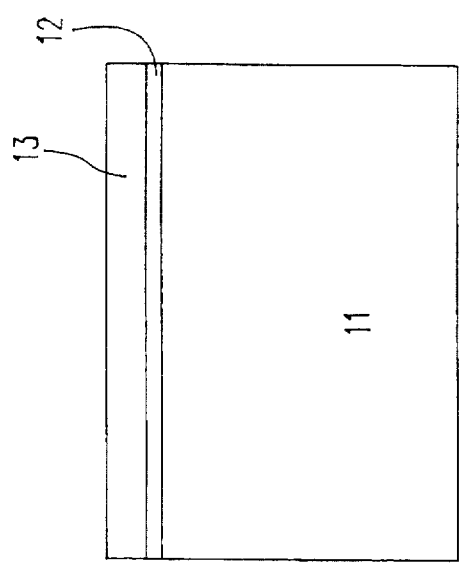

FIGS. 1A–1C illustrate an embodiment of a fabrication method according to the present invention in a P type channel device.

Referring to FIG. 1A, an N type well region 11 is first formed in a substrate. A PMOS device will be defined on to the N type well region 11. An gate oxide layer 12 is then formed overlying the top surface of the N type well region 11. The gate oxide layer 12 is a high quality oxide, and is also thin to promote for efficient switching of the device. The thickness of such gate oxide layer typically ranges from about 35 angstroms to about 50 angstroms and preferably about 40 angstroms.

A polysilicon layer 13 is formed over the gate oxide layer 12. The polysilicon layer 13 is also typically doped with a P type impurity such as boron ions to lower down the resistance of this layer. A high doping concentration is preferred and is executed by an ion implantation. Of course, the thicknesses of the oxide layer and polysilicon layer depend upon the particular application.

As shown in FIG. 1B, the polysilicon layer 13 of FIG. 1A is defined to form the polysilicon gate electrode 19 of FIG. 1B. The gate electrode 19 is often formed by any suitable series of photolithographic steps such as masking, developing, etching, and others. Each gate electrode includes edges having substantially vertical features, but may also have features which are not vertical. The exact geometry for each gate electrode 19 will depend upon the application. The length of the gate electrode 19 is typically 0.1 micron or less.

Each gate electrode 19 is then used as a mask to shallow implant P⁻ type impurities such as boron or $BF_2^+$ into a portion of the N type well 11 to form the P⁻ type LDD (lightly doped drain) regions 14. The P⁻ type implant is typically performed at a dose ranging from about $1\times10^{15}$ atoms/cm² to about $2\times10^{15}$ atoms/cm², and preferably at about $1\times10^{15}$ atoms/cm².

The following step is to deposit a layer of dielectric material, and remove horizontal surfaces of such layer. The sidewall spacers 15 on the edges of polysilicon gate electrode 19 are thus formed. The layer of dielectric layer such as borosilicate glass, silicon dioxide, silicon nitride, combination thereof, and the like is formed over the surface of the partially completed device. An anisotropic etching step is often performed on the dielectric layer to form the sidewall spacers 15. The anisotropic etching step substantially removes the horizontal surfaces of the dielectric material and leaves sidewall spacers. Either reactive ion etching, plasma etching, or alike is often used to provide the desired anisotropic characteristics.

Another implant process forms P⁺ type source/drain region 16. This implant step relies upon a dose of P⁺ type impurities (such as boron ions or $BF_2^+$) ranging from about $3\times10^{15}$ atoms/cm² to about $5\times10^{15}$ atoms/cm², and preferably $5\times10^{15}$ atoms/cm².

Then a self-aligned silicide (SALICIDE) technique is used to form the silicide layers 17 (such as $TiSi_2$ layers) respectively on the gate 19, and the source/drain 16.

The silicide layers 17 are then used as a mask to proceed the large-angle-tilt (LATI) implant to form an ion-implanted region 18. The implant step relies on a dose of N type impurity (such as arsenic ions or phosphorous ions) ranging from about $3\times10^{12}$ atoms/cm² to about $4\times10^{12}$ atoms/cm², and preferably at about $4\times10^{12}$ atoms/cm².

Thus, below the channel region between the source region and the drain region, there exist an ion-implanted region 18. The dosage distribution of the ion-implanted region 18 is shown in FIGS. 2A–2C. The vertical doping location y.peak ranges from about 50 nm to about 60 nm. The vertical broaden width of implantation y.char is at a width about 40 nm. The angle at which the implant takes place can be represented as follows, $\theta=\tan^{-1}(L_{gate}/2y.peak)$, wherein $L_{gate}$>x.peak>$L_{gate}/2$.

Figure 3C:
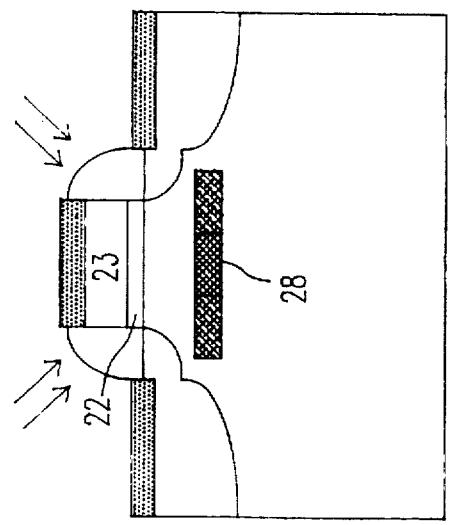
FIGS. 3A–3C illustrate an embodiment of a fabrication method according to the present invention in an N type channel device.
Figure 3B:
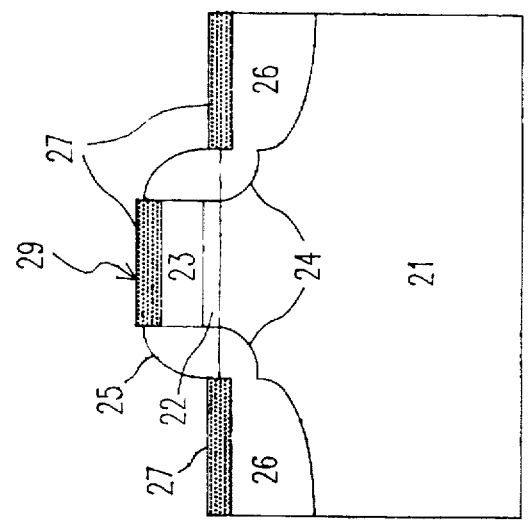
Figure 3A:
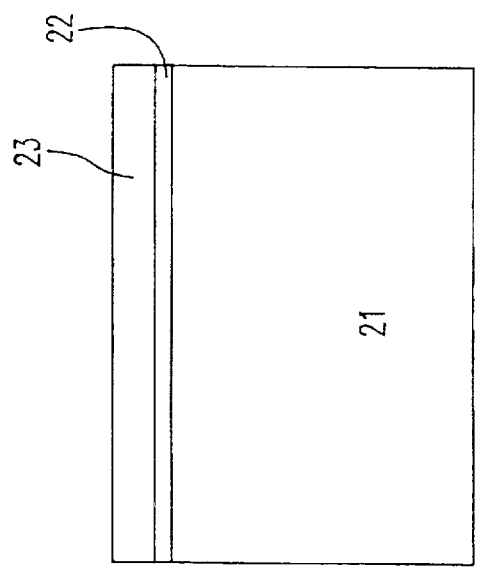

FIGS. 3A–3C illustrate an embodiment of a fabrication method according to the present invention in an N type channel device.

Referring to FIG. 3A, a P type well region 21 is first formed in a substrate. An NMOS device will be defined on to the P type well region 21. An gate oxide layer 22 is then formed overlying the top surface of the P type well region 21. The gate oxide layer 22 is a high quality oxide, and is also thin to promote for efficient switching of the device. The thickness of such gate oxide layer typically ranges from about 35 angstroms to about 50 angstroms and preferably about 40 angstroms.

A polysilicon layer 23 is formed over the gate oxide layer 22. The polysilicon layer 23 is also typically doped with an N type impurity such as arsenic ions to lower down the resistance of this layer. A high doping concentration is preferred and is executed by an ion implantation. Of course, the thicknesses of the oxide layer and polysilicon layer depend upon the particular application.

As shown in FIG. 3B, the polysilicon layer 23 of FIG. 3A is defined to form the polysilicon gate electrode 29 of FIG. 3B. The gate electrode 29 is often formed by any suitable series of photolithographic steps such as masking, developing, etching, and others. Each gate electrode includes edges having substantially vertical features, but may also have features which are not vertical. The exact geometry for each gate electrode 29 will depend upon the application.

Each gate electrode 29 is then used as a mask to shallow implant N⁻ type impurities such as arsenic ions or phosphorous ions into a portion of the P type well region 21 to form the N⁻ type LDD region 24. The N⁻ type implant is typically performed at a dose ranging from about $1\times10^{15}$ atoms/cm² to about $2\times10^{15}$ atoms/cm², and preferably at about $1\times10^{15}$ atoms/cm².

After the LDD implant, deposit a layer of dielectric material, and remove horizontal surfaces of such layer. The sidewall spacers 25 on the edges of polysilicon gate electrode are thus formed. The layer of dielectric layer such as borosilicate glass, silicon dioxide, silicon nitride, combination thereof, and the like is formed over the surface of the partially completed device. An anisotropic etching step is often performed on the dielectric layer to form the sidewall spacers 25.

Then an implant process forms N⁺ type source/drain region 26. This implant step relies upon a dose of N⁺ type impurities ranging from about $3\times10^{15}$ atoms/cm² to about $5\times10^{15}$ atoms/cm², and preferably $5\times10^{15}$ atoms/cm².

A self-aligned suicide (SALICIDE) technique is used to form the silicide layers 27 (such as $TiSi_2$ layers) respectively on the gate 29, and the source/drain 26.

The salicide layers 27 are then used as a mask to proceed the large-angle-tilt (LATI) implant to form an ion-implanted region 28. The implant step relies on a dose of P⁺ impurity such as (arsenic ions or phosphorous ions) ranging from about $3\times10^{12}$ atoms/cm² to about $5\times10^{12}$ atoms/cm², and preferably at about $5\times10^{12}$ atoms/cm².

For the gate length 0.1 um and less, after the device manufactured by the present invention is simulated and analyzed, the following advantages are apparent:

(1) The drive capability is higher.

(2) The parasitic junction capacitance is smaller.

(3) The DIBL (Drain-induced barrier lowering) is lowered.

(4) Because of the higher drive capability and the lower parasitic junction capacitance, the switch speed is faster.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. For example, while the description above is in terms of a CMOS technology, it would be possible to implement the invention with other integrated circuits technologies such as BiCMOS technology, or the like.

Therefore, the above description and illustration should not be taken as limiting the scope of the present invention which is defined by the appended claims.

What is claimed is:

1. A method of forming a semiconductor integrated circuit comprising the steps of:
   providing a semiconductor substrate having a well region of a first conductivity type;
   forming a gate electrode on said well region;
   implanting first impurities into said well region and adjacent to said gate electrode, said first implant step being at a first dose and a second conductivity type;
   forming sidewall spacers on edges of said gate electrode;
   implanting second impurities into said well region and adjacent to said gate electrode, said second implant step being at a second dose and at said second conductivity type; and
   implanting third impurities by a tilt implant into said well region and adjacent said gate electrode, said third implant step being at a third dose and at said first conductivity type, wherein a channel region underlies said gate electrode, and said third implant step forms an ion-implanted region under said channel region.

2. A method as set forth in claim 1 wherein said second implant step forms source and drain regions of a field effect transistor at said well region.

3. A method as set forth in claim 2 before said third implant step further comprising a step of forming silicide layers respectively on said gate electrode, said source, and said drain.

4. A method as set forth in claim 1 wherein first dose is less than second dose.

5. A method as set forth in claim 1 wherein said first conductivity type is an N type and said second conductivity type is a P type.

6. A method as set forth in claim 5 wherein said N type impurities are phosphorus ions.

7. A method as set forth in claim 5 wherein said N type impurities are arsenic ions.

8. A method as set forth in claim 5 wherein said P type impurities are boron ions.

9. A method as set forth in claim 5 wherein said P type impurities are $BF_2^+$.

10. A method as set forth in claim 1 wherein said first conductivity type is a P type and said second conductivity type is an N type.

11. A method as set forth in claim 10 wherein said N type impurities are arsenic ions.

12. A method as set forth in claim 10 wherein said N type impurities are phosphorus ions.

13. A method as set forth in claim 10 wherein said P type impurities are boron ions.

14. A method as set forth in claim 10 wherein said P type impurities are $BF_2^+$.

15. A method as set forth in claim 1 wherein said gate electrode comprises a polysilicon layer and a gate oxide layer.

16. A method as set forth in claim 1, wherein angle of said third implant step includes an angle greater than about 30 degrees from a perpendicular from said gate electrode.

17. A method as set forth in claim 1 wherein said first implant step forms an LDD region of a field effect transistor at said well.

* * * * *